(12) United States Patent
Sank et al.

(10) Patent No.: US 12,244,305 B2
(45) Date of Patent: Mar. 4, 2025

(54) PROBE OF QUBIT-RESONATOR DISPERSIVE SHIFT USING AC STARK SHIFT

(71) Applicant: Google LLC, Mountain View, CA (US)

(72) Inventors: Daniel Thomas Sank, Goleta, CA (US); Zijun Chen, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 561 days.

(21) Appl. No.: 17/623,034

(22) PCT Filed: Jun. 27, 2019

(86) PCT No.: PCT/US2019/039392
§ 371 (c)(1),
(2) Date: Dec. 27, 2021

(87) PCT Pub. No.: WO2020/263255
PCT Pub. Date: Dec. 30, 2020

(65) Prior Publication Data
US 2022/0261679 A1    Aug. 18, 2022

(51) Int. Cl.
*G06N 10/40* (2022.01)
*H03K 17/92* (2006.01)

(52) U.S. Cl.
CPC ............ *H03K 17/92* (2013.01); *G06N 10/40* (2022.01)

(58) Field of Classification Search
CPC ........ G06N 10/00; G06N 10/40; G06N 10/70; G06N 10/20; G06N 20/00; G06N 3/0675; G06N 3/08; G06N 3/044; G06N 3/045; G06N 99/00; G06N 5/01; G06N 10/60; G06N 3/084; G06N 10/80; G06N 3/047; G06N 3/0475; G06N 3/048; G06N 3/065; G06N 3/04; G06N 20/10; G06N 3/126; G06N 7/00; G06N 7/01; G06N 7/04; G06N 3/06; G06N 3/067; G06F 17/16; G06F 1/20; G06F 15/16; G06F 13/36; G06F 13/4068;
(Continued)

(56) References Cited

U.S. PATENT DOCUMENTS

2007/0180586 A1* 8/2007 Amin ..................... B82Y 10/00
977/755
2019/0007051 A1* 1/2019 Sete ........................ G06N 10/00
2019/0392342 A1* 12/2019 Leipold ............... H01L 29/0673

OTHER PUBLICATIONS

Gambetta et al., "Qubit-photon interactions in a cavity: measurement-induced dephasing and number splitting" Physical Review, 2006, 15 pages.
(Continued)

*Primary Examiner* — Binh C Tat
(74) *Attorney, Agent, or Firm* — Fish & Richardson P.C.

(57) ABSTRACT

Methods, systems, and apparatus for measuring the dispersive shift or linewidth of a resonator coupled to a qubit. In one aspect, a method includes the actions of: generating resonator response data, comprising, for each of two computational states of the qubit: for each of multiple qubit drive frequencies: for each of multiple resonator drive frequencies: preparing the qubit in the computational state; applying a first drive pulse with the resonator drive frequency to the resonator, applying a second drive pulse with the qubit drive frequency to the qubit; measuring the state of the qubit; and processing the generated resonator response data to determine the dispersive shift or linewidth of the resonator.

17 Claims, 4 Drawing Sheets

(58) Field of Classification Search
CPC .. G06F 15/80; G06F 11/0724; G06F 11/0751; G06F 11/0793; G06F 17/14; G06F 11/1004; G06F 3/0604; G06F 3/0659; G06F 3/0679; G06F 1/28; G06F 15/7807; G06F 17/10; G06F 2119/18; G06F 30/23; G06F 30/327; G06F 30/367; G06F 30/398; G06F 9/3877; G06F 9/5027; H01L 29/66439; H01L 29/122; H01L 33/04
USPC .................................................. 716/100–106
See application file for complete search history.

(56) References Cited

OTHER PUBLICATIONS

Gu et al., "Microwave photonics with superconducitng quantum circuits" arXiv, 2017, 170 pages.
PCT International Preliminary Report on Patentability in International Appln. No. PCT/US2019/039392, dated Jan. 6, 2022, 11 pages.
PCT International Search Report and Written Opinion in International Appln. No. PCT/US2019/039392, dated Mar. 23, 2020, 17 pages.
Schuster et al., "AC-Stark Shift and Dephasing of a Superconducting Qubit Strongly Coupled to a Cavity Field" arXiv, 2004, 4 pages.
Suri et al., "Nonlinear microwave photon occupancy of a driven resonator strongly coupled to a transmon qubit" Physical Review, 2015, 8 pages.
Office Action in Canadian Appln. No. 3143691, dated Jan. 16, 2023, 4 pages.
Office Action in Canadian Appln. No. 3,143,691, mailed on Aug. 13, 2024, 4 pages.

* cited by examiner

PROBE OF QUBIT-RESONATOR DISPERSIVE SHIFT USING AC STARK SHIFT

CROSS-REFERENCES TO RELATED APPLICATIONS

This application is a National Stage application, filed under 35 U.S.C. 371 and claims the benefit of International Patent Application No. PCT/US2019/039392 filed on Jun. 27, 2019, the entirety of which is incorporated by reference herein.

BACKGROUND

This specification relates to quantum computing.

Classical computers have memories made up of bits, where each bit can represent either a zero or a one. Quantum computers maintain sequences of quantum bits, called qubits, where each quantum bit can represent a zero, one or any quantum superposition of zero and one. Quantum computers operate by setting qubits in an initial state, controlling the qubits, e.g., according to a sequence of quantum logic gates, and measuring the qubits.

SUMMARY

This specification describes control strategies for measuring the dispersive shift of resonance frequency in a superconducting qubit system.

In general, one innovative aspect of the subject matter described in this specification can be implemented in a method for measuring the dispersive shift of a resonator coupled to a qubit, the method comprising: generating resonator response data, comprising, for each of two computational states of the qubit: for each of multiple qubit drive frequencies: for each of multiple resonator drive frequencies: preparing the qubit in the computational state; applying a first drive pulse with the resonator drive frequency to the resonator; applying a second drive pulse with the qubit drive frequency to the qubit; measuring the state of the qubit; and processing the generated resonator response data to determine the dispersive shift of the resonator.

Other implementations of these aspects include corresponding classical and/or quantum computer systems, apparatus, and classical and/or quantum computer programs recorded on one or more classical and/or quantum computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more classical and/or quantum computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the method further comprises processing the generated resonator response data to determine the linewidth of the resonator.

In some implementations processing the generated resonator response data to determine the dispersive shift of the resonator comprises comparing the generated resonator response data to determine the dispersive shift of the resonator.

In some implementations preparing the qubit in the computational state; applying a first drive pulse with the resonator drive frequency to the resonator; applying a second drive pulse with the qubit drive frequency to the qubit; and measuring the state of the qubit, is performed repeatedly and the generated response data comprises multiple data points representing a likelihood that the measured state of the qubit is in either of the two computational states of the qubit.

In some implementations comparing the generated resonator response data to determine the dispersive shift of the resonator comprises: for a first set of resonator response data corresponding to the qubit being prepared in a first computational state: identifying, for each or a subset of the multiple resonator drive frequencies, a data point representing a highest likelihood that the qubit is in the second computational state; identifying, from the identified data points, the frequency of the resonator when the qubit was in the first computational state; for a second set of resonator response data corresponding to the qubit being prepared in a second computational state: identifying, for each or a subset of the multiple resonator drive frequencies, a data point representing a highest likelihood that the qubit is in the first computational state; identifying, from the identified data points, the frequency of the resonator when the qubit was in the second computational state; and calculating a difference between the resonator frequencies corresponding to the two qubit computational states to determine the dispersive shift.

In some implementations the first drive pulse has a fixed length and fixed power.

In some implementations the method further comprises, prior to measuring the state of the qubit, allowing the resonator to ring down to a relaxed resonator photon number.

In some implementations measuring the state of the qubit comprises applying a third drive pulse with a calibrated resonator drive frequency to the resonator.

In some implementations the qubit comprises a superconducting qubit, for example a transmon or flux qubit.

In some implementations the second drive pulse comprises a pi pulse.

In some implementations the first, second and third pulse comprise radiofrequency pulses.

In some implementations the qubit and resonator are components of a quantum circuit, and wherein the method further comprises using the determined dispersive shift to verify design parameters of the quantum circuit.

In some implementations the method further comprises determining, based on the generated resonator response data, a line width that represents a measure of how strongly the resonator is coupled to an environment in which the resonator is located.

In some implementations the method further comprises determining a shape of a resonator readout pulse based on the determined dispersive shift and line width.

In some implementations the method further comprises determining, based on the generator resonator response data, a depth of dip that represents a measure of how hard the resonator is being driven.

In some implementations the method further comprises determining, based on the depth of dip, a number of photons put into the resonator during qubit readout.

The subject matter described in this specification can be implemented in particular ways so as to realize one or more of the following advantages.

Quantum computing systems implementing the techniques described in this specification can determine the dispersive shift and linewidth of a resonator with increased accuracy, reliability and reproducibility. The presently described method for measuring the dispersive shift of a resonator is self-calibrating and does not require additional system parameters, e.g., the complex S-parameters of the resonator, to be measured, nor does the method require the calibration of transfer functions of other microwave elements.

In addition, quantum computing systems implementing the techniques described in this specification can determine other measures of interest, e.g., resonator line width, which can be used with the determined dispersive shift to adjust system parameters and improve operations of the system, e.g., to optimize qubit readout.

Accurate determination of resonator dispersive shift and other measures such as resonator linewidth provide improved knowledge of the quantum computing system and enable improved operation of the quantum computing system. For example, qubits in the quantum computing system can be more effectively controlled and read out. Improved operation and control of a quantum computing system enables the computing system to perform more accurate and reliable computations.

In addition, the presently described techniques can enable improved design feedback. When devices are made, the actual parameter values realized by the device can differ from the intended parameter values. Applying the techniques described in this specification for measuring dispersive shift and linewidth can enabled improved revised designs.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Overview

Figure 1:
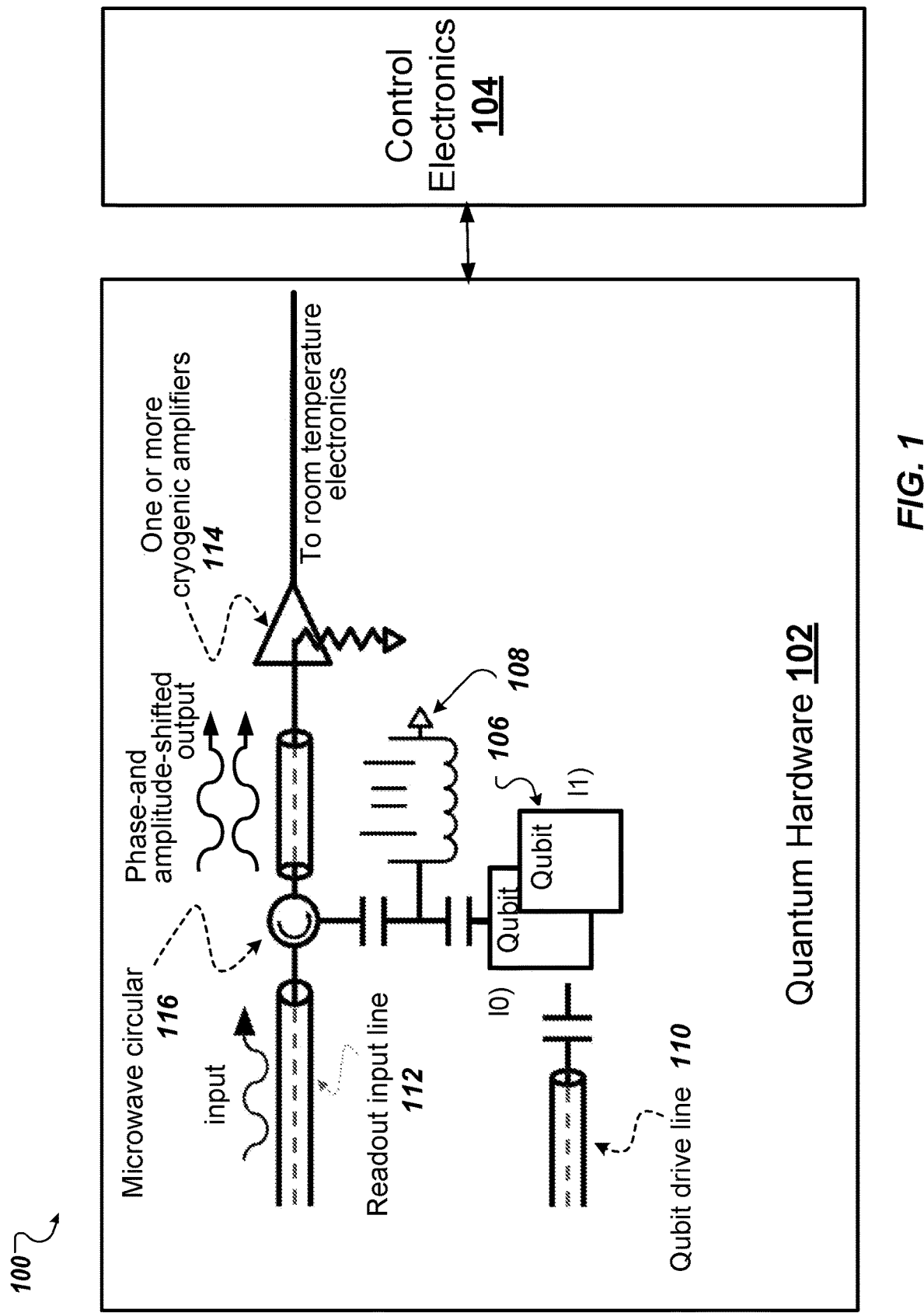
FIG. 1 depicts an example system for determining a resonator dispersive shift.

Superconducting qubits operate at microwave frequencies, meaning that the energy difference between states of the qubit is small. Experimentally measuring such small differences is challenging. For example, because of the small differences in energy it is difficult to apply photon detection techniques. In addition, directly measuring the quantum state of a superconducting qubit, e.g., by directly coupling the qubit to a measurement driveline, results in additional complications such as a reduction in energy lifetime.

To overcome these challenges, the nonlinear properties of superconducting qubits have been considered, e.g., their impedance. For example, it was shown that by coupling additional circuit elements to a qubit, such as a harmonic oscillator (resonator), changes in the state of the qubit causes the resonance frequency of the oscillator to shift. Unlike the frequency of the qubit, these shifts in oscillator frequency can be directly measured.

Measurement of the quantum state of a superconducting qubit is therefore often achieved using a scheme called "dispersive measurement". In a dispersive scheme, a linear resonator is capacitively coupled to a superconducting qubit, and the frequency of the qubit is placed off-resonance from the resonator by an amount significantly larger than the coupling. The effect of this coupling is such that the resonator's frequency will be different when the qubit is in the ground state, compared to when the qubit is in the excited state. This difference in frequency is known as the "dispersive shift", often referred to as "X".

Measuring the dispersive shift is an important step in calibrating and understanding a superconducting qubit system. From the dispersive shift, the coupling between the resonator and qubit may be computed, which can then be used to verify design parameters of the system, e.g., to tune up a readout pulse. Furthermore, matching the dispersive shift to the linewidth of the resonator enables optimization of the readout of the superconducting qubit.

One example existing method for measuring the dispersive shift includes measuring the S-parameters of the resonator directly, once with the qubit in the ground state and once with the qubit in the excited state. In principle, comparing the S-parameter dependence on probe frequency should enable a measurement of the dispersive shift. However, the dependence of the S-parameter on probe frequency is obscured by confounding factors such as the transfer function of cables, amplifiers, and other microwave elements in the signal path. Therefore, such direct probing of the resonator can produce unreliable, inaccurate results. An alternative method is to perform a Ramsey-type experiment to determine a dephasing rate and frequency shift of the qubit, which can be combined using appropriate theoretical models to produce an approximation of the dispersive shift. However, such results require additional calibration steps to determine other system parameters e.g. the number of photons in the resonator, and are therefore more likely to misrepresent the value of the dispersive shift and linewidth.

This specification describes new methods and systems for measuring the dispersive shift of a resonator accurately and reproducibly. The qubit coupled to the resonator is used as a probe of the number of photons in the resonator, bypassing complications involved with the known S-parameter measurement schemes. The method is completely insensitive to the complicated transfer functions of parametric amplifiers, cables, and all other hardware in the microwave detection chain. In addition, the provided method is self-calibrating. There are no other parameters to be measured and no need to calibrate out the transfer functions of other microwave elements.

Example Operating Environment

FIG. 1 depicts an example system 100 for determining the dispersive shift of a resonator. The example system 100 is an non-limiting example of a system implemented as classical or quantum computer programs on one or more classical computers or quantum computing devices in one or more locations, in which the systems, components, and techniques described in this specification can be implemented.

The system 100 includes quantum hardware 102 and control electronics 104 that includes control devices that operate the quantum hardware 102.

The quantum hardware 102 includes at least a qubit 106, a resonator 108 coupled to the qubit 106, and one or more drivelines. For example, the quantum hardware 102 shown in example system 100 includes a qubit drive line 110, a readout input driveline 112, one or more cryogenic amplifiers 114, and a microwave circulator 116. However, in some cases the quantum hardware 102 may include fewer, more or different components than those shown in FIG. 1, i.e., a different topology for the readout circuit may be used. The components illustrated in FIG. 1 may be subcomponents of the quantum hardware 102. For example, the quantum hardware 102 may include additional components for performing quantum or classical computations, e.g., additional qubits, additional resonators, additional control electronics and processors.

The qubit 106 and resonator 108 are frequency-tunable. In some implementations the qubit 106 may be a superconducting qubit. For example, the qubit 106 may be a transmon or flux qubit. In other implementations other qubit architectures may be used instead, e.g., any qubit realization that can be dispersively read out. The qubit 106 can be prepared in either of two computational states or a superposition state, although for the purpose of the presently described techniques the qubit will be prepared in a non-superposition state. For convenience and as a non-limiting example, this specification uses the ground state |0⟩ and the first excited state |1⟩ as the two computational qubit states. It will, however, be appreciated that the technique can be applied between any pair of states.

The frequency of the qubit 106 is tuned via application of control signals (pulses) with respective qubit drive frequencies through the qubit driveline 110 via the control electronics 104. For example, the control electronics 104 may include an arbitrary waveform generator, e.g., a digital to analog converter (DAC) and various frequency filters, that generates pulses to be applied to the qubit 106 and/or resonator 108.

In addition, the control electronics 104 can perform measurements of the qubit 106 through the readout input line 112. Measurement of the qubit 106 determines the state of the qubit 106. The control electronics 104 can store, display, and/or further process the results of each of the measurements of the qubit 106.

The control electronics 104 may include a data processing apparatus and associated memory. The memory may include a computer program having instructions that, when executed by the data processing apparatus, cause the data processing apparatus to perform one or more functions described herein, such as applying a control signal to a qubit and/or to a resonator to generate resonator response data (as described in more detail below with reference to FIGS. 2-4), and processing generated resonator response data to determine a dispersive shift (as described in more detail below with reference to FIGS. 3 and 5).

Figure 2:
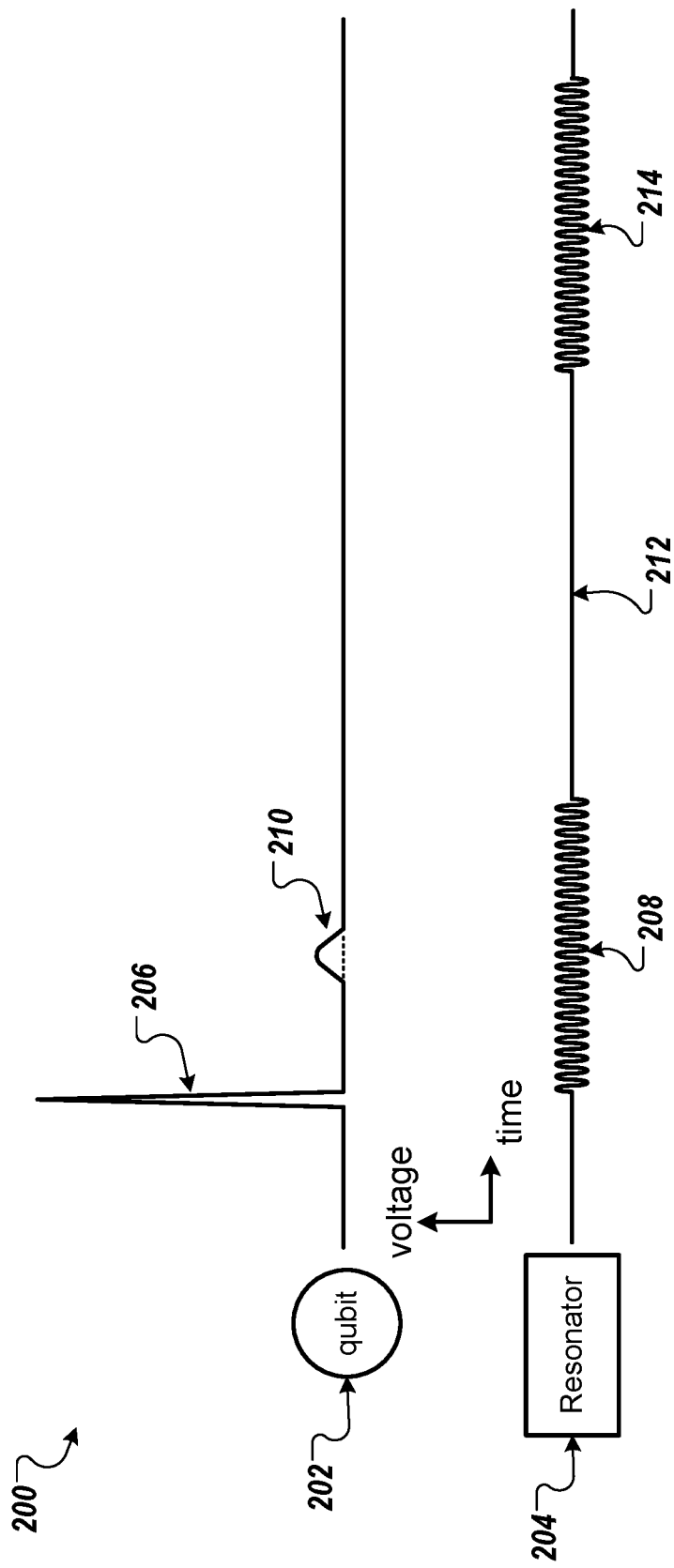
FIG. 2 depicts an example implementation of applying control signals to a qubit and resonator to generate resonator response data.

FIG. 2 is an illustration 200 of an example implementation of applying control signals to a qubit and resonator to generate resonator response data. The illustration 200 is an example implementation of using the system 100 of FIG. 1 to apply control signals to a qubit and resonator to generate resonator response data for determining the dispersive shift of the resonator.

In the illustration 200, drive pulses are applied to a qubit 202 and to a resonator 204 coupled to the qubit 202. For example, the qubit 202, resonator 204, and illustrative drive pulses 206-214 may correspond to the qubit 106, resonator 108, and control signals generated by control electronics 104 and applied via drive lines 110 and 112 of FIG. 1.

During the example implementation, the qubit 202 is prepared in either the ground or first excited state (depending on which set of resonator response data is being generated, as described in more detail below with reference to FIG. 3.) Preparing the qubit in either the ground or first excited state may be achieved by applying an initial pulse 206 with a particular frequency to the qubit 202 via a qubit driveline coupled to the qubit 202. If the qubit is prepared in the zero state |0⟩, then the resonator has frequency $\omega_0$. If the qubit is prepared in one state |1⟩, the resonator has frequency $\omega_1$. The difference $\omega_1 - \omega_0$ is $2\chi$.

The resonator 204 is then driven by application of a first drive pulse 208 on a corresponding resonator driveline coupled to the resonator 204. The frequency of this pulse is varied for each repetition of the experiment. In repetitions when the frequency of the pulse is near the resonance frequency of the resonator, the pulse drives photons into the resonator. On repetitions when the frequency of the pulse is far from the resonance frequency of the resonator, then the pulse drives few or no photons to the resonator. When photons are added to the resonator, the qubit frequency shifts by the "ac Stark shift". The degree of ac Stark shift depends on the number of photons in the resonator, and on the dispersive shift.

A second drive pulse 210 is applied to the qubit 202 on a corresponding drive line coupled to the qubit 202. The qubit drive frequency is varied on each repetition of the experiment, and in each implementation the set of possible qubit drive frequencies may differ. When the frequency of the drive pulse 210 matches the frequency of the ac Stark shifted qubit, then the qubit changes state, either from |0⟩ to |1⟩ or from |1⟩ to |0⟩).

The resonator 204 is then allowed to ring down to a relaxed resonator photon number 212. The state of the qubit 202 is measured by application of a third drive pulse 214 with a calibrated resonator drive frequency to the resonator 204. As described in more detail below with reference to FIGS. 3 and 4, the measured state of the qubit is used to generate resonator response data, which in turn is used to determine the resonator dispersive shift and linewidth.

Example Method for Determining Resonator Dispersive Shift

Figure 3:
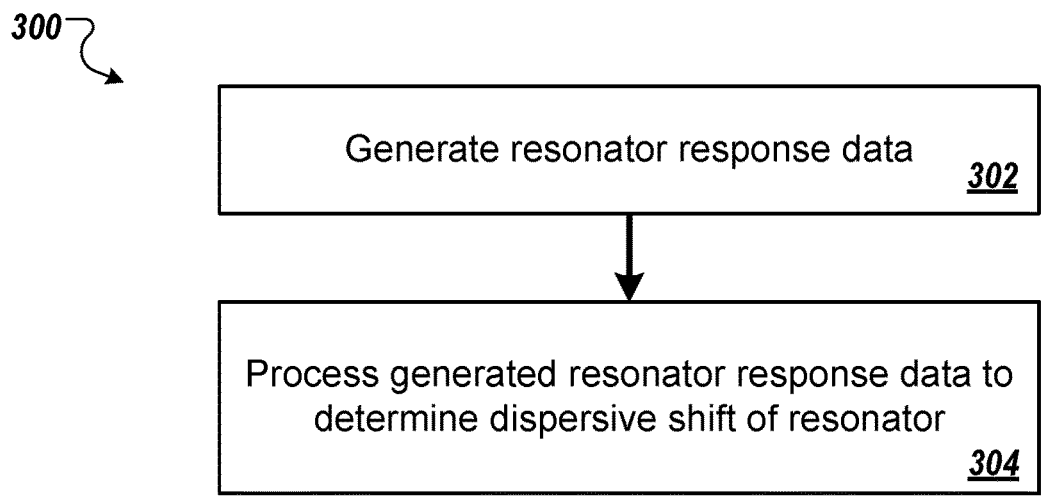
FIG. 3 is a flow chart of an example process for determining a dispersive shift and linewidth of a resonator coupled to a qubit.

FIG. 3 is a flow diagram of an example process 300 for determining the dispersive shift of a resonator coupled to a qubit. For convenience, the process 300 will be described as being performed by quantum hardware in communication with control electronics located in one or more locations. For example, the system 100 of FIG. 1, appropriately programmed in accordance with this specification, can perform the process 300.

Resonator response data is generated (step 302). The resonator response data includes multiple data points that characterize how the resonator (and qubit) responds to being driven by a pulse with a particular resonator (and qubit) drive frequency. In particular, the generated resonator response data includes multiple data points, with each data point corresponding to a fixed qubit drive frequency and resonator drive frequency and including a value representing a likelihood that the qubit to which the resonator is coupled flips its state when a pulse with the fixed qubit drive frequency is applied to the qubit and a pulse with the fixed resonator drive frequency is applied to the resonator. An example process for generating a resonator response data point corresponding to a fixed resonator drive frequency and fixed qubit drive frequency is described in detail below with reference to FIG. 4.

The generated resonator response data includes two sets of data—a first set corresponding to the qubit being prepared in a first computational state and a second set corresponding to the qubit being prepared in a second computational state. The first computational state and second computational state, by definition, are non-superposition states. For example, the first computational state may be the ground state and the second computational state may be the first exited state. Other pairs of computational states may alternatively be used.

The generated resonator response data is processed to determine the resonator dispersive shift (step 304). Processing the generated resonator response data can include comparing the data to determine the dispersive shift, e.g., comparing the first set of resonator response data that corresponds to the qubit being prepared in the first computational state to the second set of resonator response data that corresponds to the qubit being prepared in the second computational state to determine a frequency offset between the two sets of data.

For example, the first set of resonator response data can be processed to identify, for each or a subset of the multiple resonator drive frequencies used to generate resonator response data, a data point that represents the highest likelihood that the qubit is now in the first excited state. Referring to plot (a) of FIG. 5 as a non-limiting example, for resonator drive frequency 4.675 GHz a data point 502 corresponding to qubit drive frequency 5.498 GHz may be identified (since on the vertical line corresponding to resonator drive frequency 4.675 GHz, the data point corresponding to qubit drive frequency 5.489 GHz is the darkest point.) Identifying such data points results in a resonator response curve of data points, e.g., similar to that shown in plot (c) of FIG. 5.

A first data point on the resonator response curve that corresponds to a lowest qubit drive frequency can then be identified. Again, referring to plot (c) of FIG. 5 as a non-limiting example, the data point 504 may be the identified data point corresponding to resonator drive frequency 4.694 GHz and qubit drive frequency 5.451 GHz.

This process can be repeated for the second set of resonator response data to identify, for each or a subset of the multiple resonator drive frequencies used to generate resonator response data, a data point that represents the highest likelihood that the qubit is now in the ground state. A second data point on the resonator response curve that corresponds to a lowest qubit drive frequency can then be identified.

Figure 5:
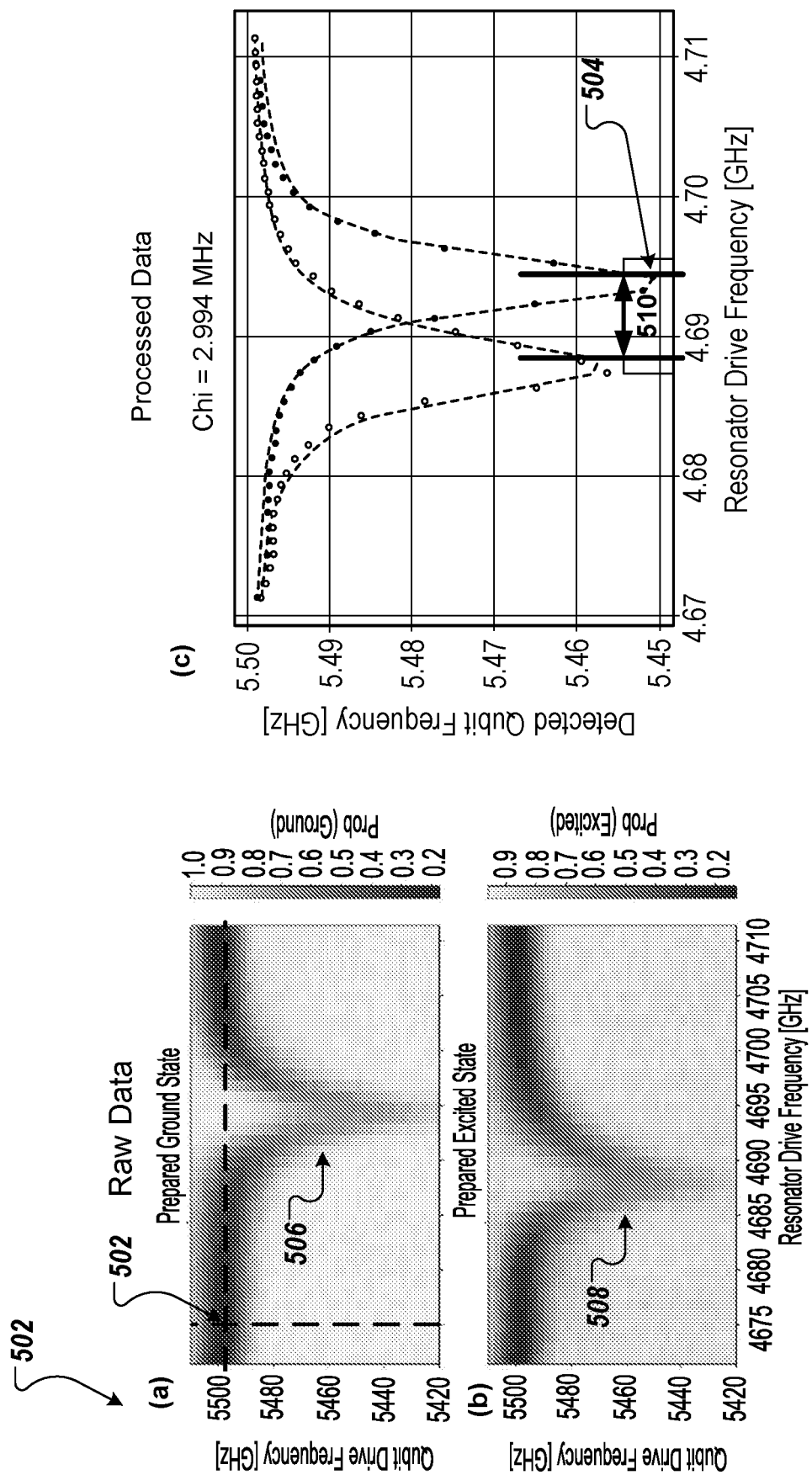
FIG. 5 shows an example set of raw and processed resonator response data.

The difference in resonator drive frequency between the first data point and the second data point can then be calculated, as illustrated in FIG. 5. By definition, this difference in frequency is equal to twice the resonator dispersive frequency.

As another example, a function can be fitted to both the first set of resonator response data and to the second set of resonator response data. The fitted function may be a resonance function, i.e. a function that describes a given type of resonance. For example, the resonance function may be a Lorentzian. The fitted functions can then be used to determine respective frequencies of the resonator when the qubit was in the first or the second computational state. For example, a Lorentzian can be fitted to the first set of resonator response data. The center of the Lorentzian may then be taken as an approximation to the frequency of the resonator when the qubit was in the first computational state. Similarly, a Lorentzian can also be fitted to the second set of resonator response data. The center of the Lorentzian (e.g. its minimum value) may then be taken as an approximation to the frequency of the resonator when the qubit was in the second computational state. The differences between the approximated resonator frequencies can then be used to determine the resonator dispersive frequency.

The generated resonator response data and determined dispersive shift can be used to determine or verify other quantities of interest. For example, the dispersive shift can be used to compute the coupling between the qubit and the resonator, which in turn can be used to verify design parameters of quantum circuitry which the resonator and qubit may be a part of, e.g., the coupling capacitance between the qubit and the resonator. Verification of design parameters provides a better understanding of the quantum circuitry, and can be used to calibrate the quantum circuitry.

As another example, the generated resonator response data may be further processed to determine a linewidth of the resonator (e.g. a Q-value). The linewidth of the resonator represents a measure of how strongly the resonator is coupled to the environment in which it is located, e.g., the coupling between the resonator and its driveline. As described above, the linewidth can be used to verify design parameters of quantum circuitry which the resonator and qubit may be part of, e.g. the capacitance or mutual inductance between the resonator and its drive line. The linewidth is a parameter that is often designed for but is difficult to predict from simulation. Obtaining an experimental value can provide information about how to operate the quantum circuitry, e.g., by providing an indication as to whether the resonator should be moved closer to or further away from the drive line. The linewidth can, for example, be derived from the width of the function fitted to the resonator response data, such as the full-width at half-maximum of the fitted function.

In some implementations the determined dispersive shift and line width may be used to determine an improved shape of a resonator readout pulse, e.g., which can be used in future measurement operations. More specifically, the dispersive shift determines how much "information" is obtained per photon of energy in the resonator, and the linewidth determines the rate at which energy can get in and out of the resonator. By knowing these two parameters, pulse shapes can be designed so that the information per time is increased or maximized.

As another example, the generated resonator response data may be used to determine a depth of dip of the resonator response curve, e.g., curve 506 of FIG. 5. For example, the depth of dip may be determined from a difference between the minimum value of the resonant response data (or the function fitted to the resonant response data) and the "off resonance" value of the resonant response data. The depth of dip represents a measure of how hard the resonator is being driven, i.e., a link between how the resonator is driven and the number of photons put into the resonator when the qubit is measured (readout). This measure can be useful for various reasons, including settings where the number of photons in the resonator is to be limited when performing a quantum measurement (since exceeding certain photon numbers can lead to unwanted transitions of the qubit state (reference)). Having a calibration of the number of photons vs resonator drive power also provides insight into how much the qubit frequency will shift when a measurement is performed, and this value can be important when trying to measure multiple coupled qubits.

Figure 4:
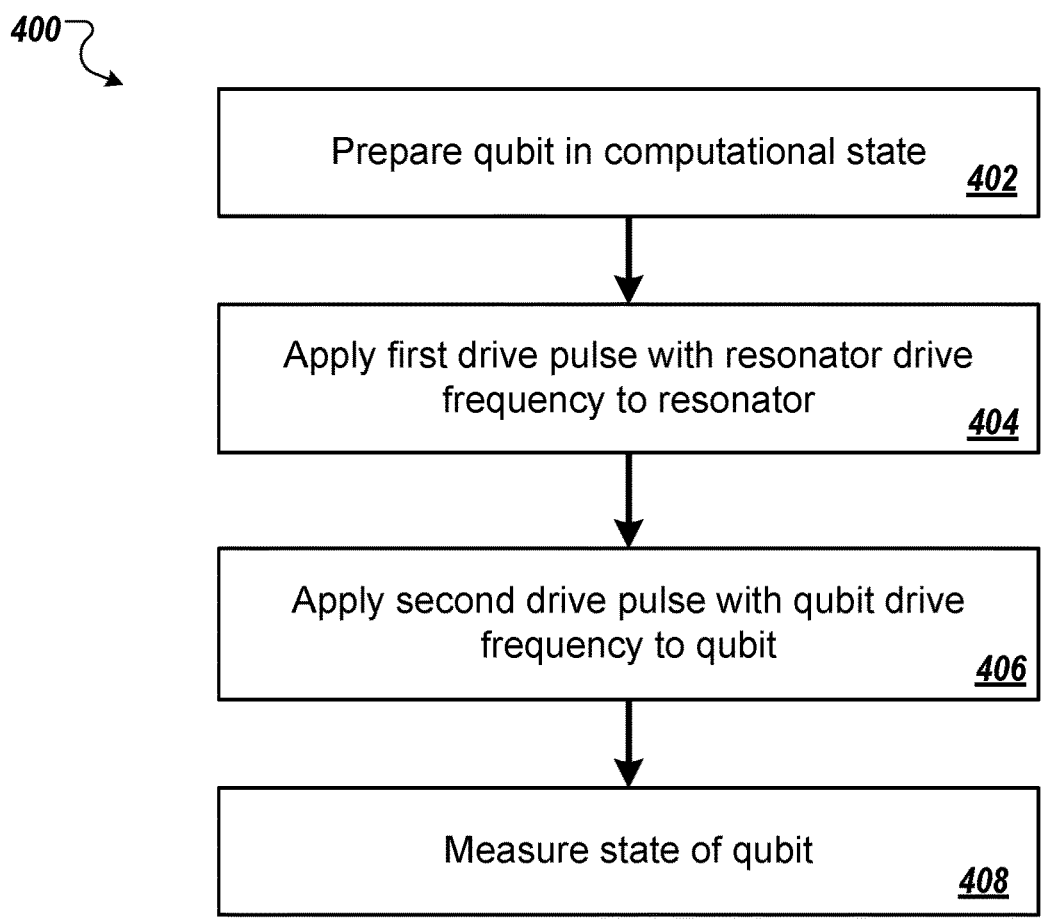
FIG. 4 is a flow chart of an example process for generating a resonator response data point corresponding to a fixed resonator drive frequency and fixed qubit drive frequency.

FIG. 4 is a flow diagram of an example process 400 for generating a resonator response data point corresponding to a fixed resonator drive frequency and fixed qubit drive frequency, and for a resonator coupled to a qubit in one of two computational states. For example, the example process 400 can be used to generate resonator response data as part of example process 300 of FIG. 3. For convenience, the process 400 will be described as being performed by quantum hardware in communication with control electronics located in one or more locations. For example, the system 100 of FIG. 1, appropriately programmed in accordance with this specification, can perform the process 400.

The qubit is prepared in the computational state (step 402). For example, in cases where the resonator response data point belongs to the above described first set of resonator response data, the qubit may be prepared in a ground state. Alternatively, in cases where the resonator response data point belongs to the above described second set of resonator response data, the qubit may be prepared in a first excited state.

A first drive pulse with the fixed resonator drive frequency is applied to the resonator (step 404). The first drive pulse may have a fixed length and a fixed power. The pulse may be long enough to drive the resonator into equilibrium, e.g., longer than 1/linewidth, but shorter than the T1 decay time of the qubit. However, the exact length may be determined a priori based on the design of the hardware. The fixed power may be chosen so that enough signal in the measurement is obtained, but not high enough for higher order nonlinearities to come into play. In some implementations the fixed power may be chosen to be of order the power required to do standard qubit measurement.

Application of the first drive pulse excites the resonator. This excitation causes the qubit coupled to the resonator to shift frequency. This qubit frequency shift is called the "ac Stark shift", and it's magnitude is equal to $2\chi n$ where $\chi$ represents the dispersive shift of the resonator and n represents the number of photons introduced into the resonator by the first drive pulse. The value of n depends on the frequency of the first drive pulse. When the frequency of the first drive pulse is on resonance with the resonator, n will be large, e.g., around 10 or 20. When the frequency of the first drive pulse is far from the resonator's resonance, then n will be small, e.g., around 1.

A second drive pulse with the fixed qubit drive frequency is applied to the qubit (step 406). In some implementations the second drive pulse may be a pi pulse. When the fixed qubit drive frequency is on resonance or near resonance with the qubit's frequency, the state of the qubit flips from the first computational state, e.g., the ground state, to the second computational state, e.g., the first excited state, with probability 1 or close to 1. The qubit's frequency depends on how hard and at what frequency the resonator is being driven (i.e., the number of photons in the resonator) via the first drive pulse due to the ac Stark shift. If the first drive pulse is not near resonance with the resonator a flip of the qubit state can still be achieved by driving the qubit and its un-shifted frequency via the second drive pulse.

In some implementations the resonator may be allowed to ring down to a relaxed resonator photon number after steps 404 and 406 are performed, and before step 408 is performed.

The state of the qubit is measured (step 408). Measuring the state of the qubit may include applying a third resonator drive pulse with a calibrated resonator drive frequency to the resonator. The measurement result (and its associated qubit preparation state, qubit drive frequency and resonator drive frequency) may be used as the resonator response data point. Alternatively, the process 400 may be repeated multiple times, e.g., 1000 times, with the fixed qubit drive frequency and fixed resonator drive frequency to determine an average measurement result that may be used as the resonator response data point.

FIG. 5 shows example sets of raw and processed resonator response data. In particular, plots (a) and (b) show example sets of raw resonator response data, e.g., generated using the example process 400 described above. Plot (a) corresponds to the qubit being prepared in the ground state and plot (b) corresponds to the qubit being prepared in the first excited state. Plot (c) shows example sets of processed resonator response data, e.g., processed using the techniques described in example process 300 described above.

Plots (a), (b) and (c) include an x-axis representing resonator drive frequency (in GHz) and a y-axis representing qubit drive frequency (in GHz). The range of frequency values shown in plots (a) and (b)—namely resonator drive frequency between 4.670 GHz and 4.715 GHz and qubit drive frequency between 5.420 GHz and 5.510 GHz—are specific to the example qubit-resonator system considered in FIG. 5. In other qubit-resonator systems the range of frequencies may vary.

The shading shown in plots (a) and (b) represents the probability that the state of the qubit is measured in the ground state or first excited state, respectively. That is, each point on plot (a) represents a probability that the state of the qubit remains in the ground state during the example process 400 with a corresponding fixed resonator drive frequency and qubit drive frequency. The lighter shading indicates a higher probability that the qubit remains in the ground state than darker shading. Similarly, each point on plot (b) represents a probability that the state of the qubit remains in the first excited state during the example process 400 with a corresponding fixed resonator drive frequency and qubit drive frequency. The lighter shading indicates a higher probability that the qubit remains in the first excited state than darker shading.

As shown in plots (a) and (b), the generated resonator response data exhibits resonator response curves 506 and 508, respectively. Differences between the resonator response data, in particular the resonator response curves 406 and 408, are used to determine the dispersive shift.

Plot (c) shows processed resonator response data, where data points corresponding to both resonator response curves 506 and 508 have been extracted and fitted (e.g., using the techniques described above with reference to FIG. 3,) and overlaid on one plot. The frequency offset between the two resonator response curves, illustrated in plot (c) of FIG. 5 using arrow 510 is equal to twice the dispersive frequency.

Implementations of the subject matter and operations described in this specification can be implemented in digital electronic circuitry, analog electronic circuitry, suitable quantum circuitry or, more generally, quantum computational systems, in tangibly-embodied software or firmware, in computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable computers, operating with one or more processors, as appropriate, executing one or more computer programs to perform functions by operating on input data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions. For example, a quantum computer may receive instructions from a digital computer that, when executed by the quantum computing apparatus, cause the apparatus to perform the operations or actions.

Computers suitable for the execution of a computer program can be based on general or special purpose processors, or any other kind of central processing unit. Generally, a central processing unit will receive instructions and data from a read-only memory, a random access memory, or quantum systems suitable for transmitting quantum data, e.g. photons, or combinations thereof.

The elements of a computer include a central processing unit for performing or executing instructions and one or more memory devices for storing instructions and digital, analog, and/or quantum data. The central processing unit and the memory can be supplemented by, or incorporated in, special purpose logic circuitry or quantum simulators. Generally, a computer will also include, or be operatively coupled to receive data from or transfer data to, or both, one or more mass storage devices for storing data, e.g., magnetic, magneto-optical disks, optical disks, or quantum systems suitable for storing quantum information. However, a computer need not have such devices.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

In certain cases, some or all of the quantum and/or classical circuit elements may be implemented using, e.g., superconducting quantum and/or classical circuit elements. Fabrication of the superconducting circuit elements can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin) and niobium (superconducting critical temperature of 9.3 kelvin). Accordingly, superconducting structures, such as superconducting traces and superconducting ground planes, are formed from material that exhibits superconducting properties at or below a superconducting critical temperature.

In certain implementations, control signals for the quantum circuit elements (e.g., qubits and qubit couplers) may be provided using classical circuit elements that are electrically and/or electromagnetically coupled to the quantum circuit elements. The control signals may be provided in digital and/or analog form.

Computer-readable media suitable for storing computer program instructions and data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a computer program product that includes instructions that are stored on one or more non-transitory machine-readable storage media, and that are executable on one or more processing devices. The systems described in this specification, or portions of them, can each be implemented as an apparatus, method, or system that may include one or more processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. A method for measuring a dispersive shift of a resonator coupled to a qubit, the method comprising:
  generating resonator response data, comprising, for each of two computational states of the qubit:
    for each of multiple qubit drive frequencies:
      for each of multiple resonator drive frequencies:
        preparing the qubit in the computational state;

applying a first drive pulse with the resonator drive frequency to the resonator, wherein application of the first drive pulse drives a number of photons into the resonator and causes a shift in a frequency of the qubit coupled to the resonator, the number of photons and size of shift being dependent on the resonator drive frequency;

applying a second drive pulse with the qubit drive frequency to the qubit, wherein application of the second drive pulse causes the qubit to flip the computational state when the qubit drive frequency matches the shifted frequency of the qubit;

measuring the state of the qubit to obtain a measurement result;

providing the measurement result, associated computational state, resonator drive frequency and qubit drive frequency as resonator response data; and processing the generated resonator response data, comprising calculating a difference between resonator frequencies that correspond to the two computational states of the qubit to determine the dispersive shift of the resonator.

2. The method of claim 1, further comprising processing the generated resonator response data to determine the linewidth of the resonator.

3. The method of claim 1, wherein processing the generated resonator response data to determine the dispersive shift of the resonator comprises comparing a first set of resonator response data that corresponds to the qubit being prepared in a first computational state of the two computational states to a second set of resonator response data that corresponds to the qubit being prepared in a second computational state of the two computational states to determine the dispersive shift of the resonator.

4. The method of claim 3, wherein:
preparing the qubit in the computational state;
applying a first drive pulse with the resonator drive frequency to the resonator;
applying a second drive pulse with the qubit drive frequency to the qubit; and
measuring the state of the qubit,
is performed repeatedly and the generated response data comprises multiple data points representing a likelihood that the measured state of the qubit is in either of the two computational states of the qubit.

5. The method of claim 4, wherein comparing the first set of resonator response data to the second set of resonator response data to determine the dispersive shift of the resonator comprises:
for the first set of resonator response data corresponding to the qubit being prepared in the first computational state:
identifying, for each or a subset of the multiple resonator drive frequencies, a data point representing a highest likelihood that the qubit is in the second computational state;
identifying, from the identified data points, the frequency of the resonator when the qubit was in the first computational state;
for the second set of resonator response data corresponding to the qubit being prepared in the second computational state:
identifying, for each or a subset of the multiple resonator drive frequencies, a data point representing a highest likelihood that the qubit is in the first computational state;
identifying, from the identified data points, the frequency of the resonator when the qubit was in the second computational state; and
calculating the difference between the resonator frequencies corresponding to the two computational states to determine the dispersive shift.

6. The method of claim 1, wherein the first drive pulse has a fixed length and fixed power.

7. The method of claim 1, wherein the method further comprises, prior to measuring the state of the qubit, allowing the resonator to ring down to a relaxed resonator photon number.

8. The method of claim 1, wherein measuring the state of the qubit comprises applying a third drive pulse with a calibrated resonator drive frequency to the resonator.

9. The method of claim 1 wherein the qubit comprises a superconducting qubit, for example a transmon or flux qubit.

10. The method of claim 1, wherein the second drive pulse comprises a pi pulse.

11. The method of claim 1, wherein the first, second and third pulse comprise radiofrequency pulses.

12. The method of claim 1, wherein the qubit and resonator are components of a quantum circuit, and wherein the method further comprises using the determined dispersive shift to verify design parameters of the quantum circuit.

13. The method of claim 1, further comprising determining, based on the generated resonator response data, a line width that represents a measure of how strongly the resonator is coupled to an environment in which the resonator is located.

14. The method of claim 13, further comprising determining a shape of a resonator readout pulse based on the determined dispersive shift and line width.

15. The method of claim 1, further comprising determining, based on the generator resonator response data, a depth of dip that represents a measure of how hard the resonator is being driven.

16. The method of claim 15, further comprising determining, based on the depth of dip, a number of photons put into the resonator during qubit readout.

17. An apparatus comprising:
quantum hardware comprising:
a qubit coupled to a qubit driveline;
a resonator coupled to the qubit and coupled to a resonator driveline;
control electronics configured to generate and apply pulses via the qubit driveline and resonator driveline to the qubit and to the resonator;
one or more classical processors;
wherein the apparatus is configured to perform operations comprising:
generating resonator response data, comprising, for each of two computational states of the qubit:
for each of multiple qubit drive frequencies:
for each of multiple resonator drive frequencies:
preparing the qubit in the computational state;
applying a first drive pulse with the resonator drive frequency to the resonator, wherein application of the first drive pulse drives a number of photons into the resonator and causes a shift in a frequency of the qubit coupled to the resonator, the number of photons and size of shift being dependent on the resonator drive frequency;

applying a second drive pulse with the qubit drive frequency to the qubit, wherein application of the second drive pulse causes the qubit to flip the computational state when the qubit drive frequency matches the shifted frequency of the qubit;

measuring the state of the qubit to obtain a measurement result;

providing the measurement result, associated computational state, resonator drive frequency and qubit drive frequency as resonator response data; and processing the generated resonator response data, comprising calculating a difference between resonator frequencies that correspond to the two computational states of the qubit to determine a dispersive shift of the resonator.

* * * * *